(12) United States Patent
Fujii et al.

(10) Patent No.: US 7,960,202 B2
(45) Date of Patent: Jun. 14, 2011

(54) PHOTODIODE ARRAY HAVING SEMICONDUCTOR SUBSTRATE AND CRYSTAL FUSED REGIONS AND METHOD FOR MAKING THEREOF

(75) Inventors: Yoshimaro Fujii, Hamamatsu (JP);
Kouji Okamoto, Hamamatsu (JP);
Akira Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 208 days.

(21) Appl. No.: 11/987,478

(22) Filed: Nov. 30, 2007

(65) Prior Publication Data
US 2008/0096304 A1   Apr. 24, 2008

Related U.S. Application Data

(62) Division of application No. 11/333,544, filed on Jan. 18, 2006, now abandoned.

(51) Int. Cl.
*H01L 21/00* (2006.01)
(52) U.S. Cl. .......................................... 438/80; 438/406
(58) Field of Classification Search ............... 438/406, 438/80
See application file for complete search history.

(56) References Cited

U.S. PATENT DOCUMENTS

| | | | | |
|---|---|---|---|---|
| 3,955,082 A * | 5/1976 | Dyment | ................. | 257/184 |
| 4,868,622 A * | 9/1989 | Shigenaka | ................. | 257/442 |
| 4,979,002 A * | 12/1990 | Pankove | ................. | 257/85 |
| 5,426,626 A * | 6/1995 | Katayama | ................. | 369/44.41 |
| 6,133,615 A * | 10/2000 | Guckel et al. | ................. | 257/446 |
| 2006/0011593 A1* | 1/2006 | Fukuyo et al. | ................. | 219/121.67 |

FOREIGN PATENT DOCUMENTS

| | | |
|---|---|---|
| JP | 61133659 | 6/1986 |
| JP | 62086756 | 4/1987 |
| JP | 63128677 | 6/1988 |
| JP | 09-232420 | 9/1997 |
| JP | 2001-352094 | 12/2001 |
| JP | 2002-192370 | 7/2002 |
| JP | 2003-007993 | 1/2003 |
| JP | 2005-019465 | 1/2005 |

* cited by examiner

*Primary Examiner* — Thanh V Pham
*Assistant Examiner* — Caleb Henry
(74) *Attorney, Agent, or Firm* — Drinker Biddle & Reath LLP

(57) ABSTRACT

Disclosed is a photodiode array comprising a semiconductor substrate; a plurality of photodiodes formed on the semiconductor substrate; and crystal fused regions losing crystallinity by fusing a semiconductor material of the photodiodes between the plurality of photodiodes.

4 Claims, 14 Drawing Sheets

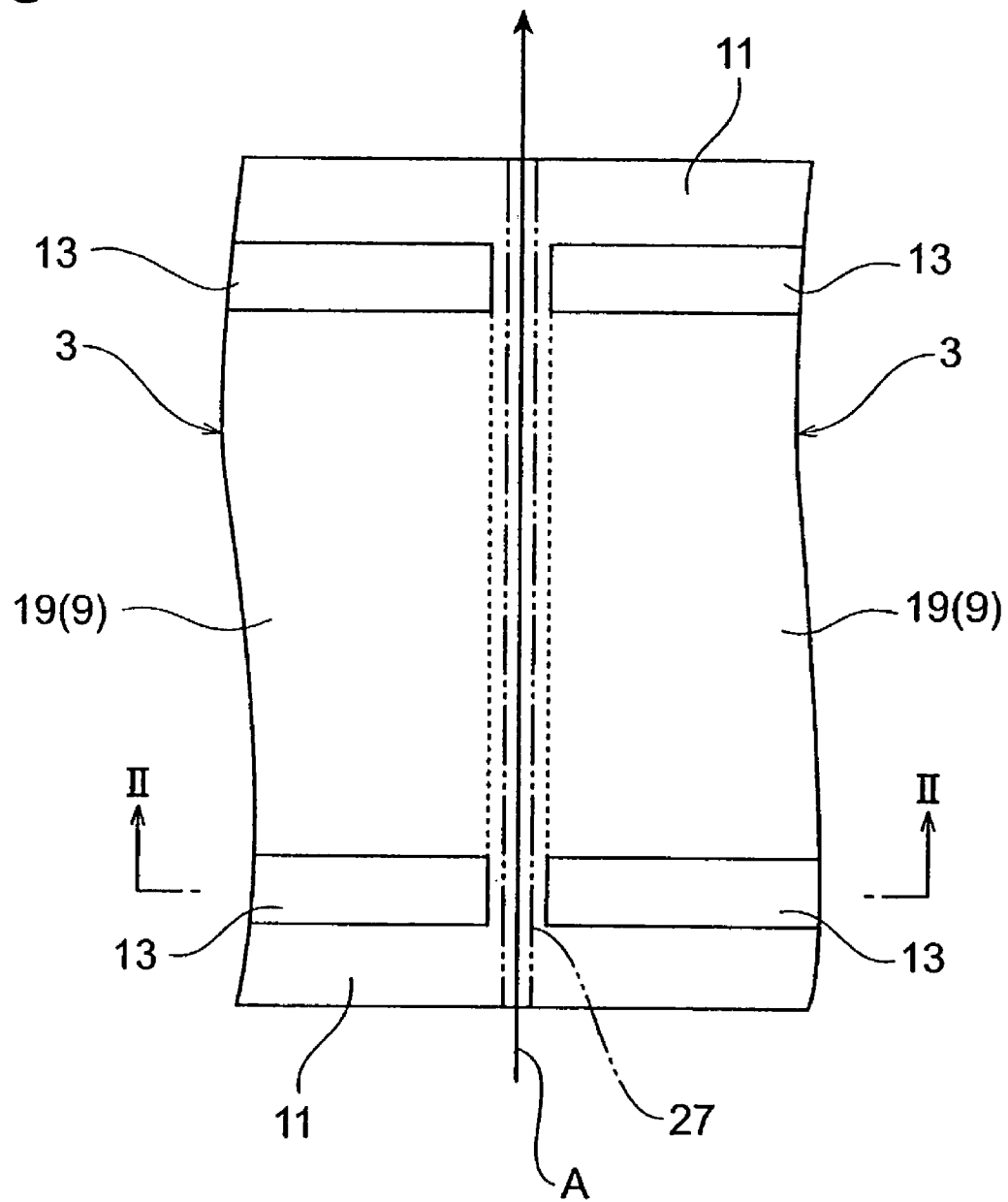

PHOTODIODE ARRAY HAVING SEMICONDUCTOR SUBSTRATE AND CRYSTAL FUSED REGIONS AND METHOD FOR MAKING THEREOF

This is a divisional application of application Ser. No. 11/333,544, filed on Jan. 18, 2006, now abandoned which is incorporated by reference herein in its entirety.

BACKGROUND OF THE INVENTION

1. Field of the Invention

The present invention relates to a photodiode array.

2. Related Background of the Invention

A multichannel photodiode and a photodiode array have been known as a photodetecting element having a plurality of pixel regions formed on the same substrate. The greatest problem of the multichannel photodiode and photodiode array is cross talk between pixels.

As a method for preventing cross talk between the pixels, for embodiment, a structure where trench grooves are formed between the pixels and the trench grooves are filled with an insulating material to maintain the mechanical strength is disclosed in Japanese Patent Laid-Open Publication No. 2001-352094. FIG. 13 is a sectional view showing a photodiode array disclosed in Japanese Patent Laid-Open Publication No. 2001-352094. With reference to FIG. 13, a photodiode array 100 is provided with a plurality of photodiodes 101. The photodiode 101 consists of an n-type semiconductor layer 102 and a p-type semiconductor layer 103. An element isolating trench groove 104 is formed between the plurality of photodiodes 101, and the surface of the trench groove 104 is covered with an insulating layer 105. The trench groove 104 is filled with a filling material 106.

However, since three steps (a step of forming the trench groove 104, a step of forming the insulating layer 105 on the surface of the trench groove 104, and a step of filling the trench groove 104) are required in the case of the above-mentioned photodiode array 100, working hours according to these steps are required. Though it is also considered that the step of filling the trench groove 104 is omitted, the mechanical strength of the photodiode array 100 is reduced.

SUMMARY OF THE INVENTION

The present invention provides a photodiode array capable of being formed by a simple step and of preventing cross talk while maintaining the mechanical strength, and a method for making the same.

A photodiode array of an embodiment according to the present invention including a plurality of photodiode arrays formed on the semiconductor substrate is characterized by comprising crystal fused regions losing crystallinity by fusing a semiconductor material of the photodiodes between the plurality of photodiodes.

The above-mentioned photodiode array is provided with crystal fused regions formed between the plurality of photodiodes. The semiconductor material loses the crystallinity in the crystal fused regions. Since the crystal fused region prevents carriers from leaking to the adjoining photodiode, cross talk between the plurality of photodiodes can be suitably prevented.

Means for preventing cross talk can be obtained by only forming the crystal fused region in the above-mentioned photodiode array. Therefore, the above-mentioned photodiode array can simplify the manufacturing process as compared with the conventional photodiode array requiring the step of forming the trench groove and the insulating layer, and the step of filling the trench groove. Since the above-mentioned photodiode array is not provided with a physical groove, the mechanical strength of the photodiode array can be maintained.

The photodiode array is preferably provided with the crystal fused regions formed by adjusting converging points between the plurality of photodiodes and by being irradiated by laser lights. In this case, multiphoton absorption is generated because the laser light is irradiated and converged, and thereby the crystal can be fused.

The photodiode array is characterized by comprising a first semiconductor layer having the same conductive type as that of the semiconductor substrate and epitaxially grown on the semiconductor substrate; and a plurality of second semiconductor layers having an opposite conductive type to that of the semiconductor substrate and formed on the surface side of the first semiconductor layer, the crystal fused regions are formed between the plurality of second semiconductor layers and reaches the semiconductor substrate from the surface of the first semiconductor layer.

In the above-mentioned photodiode array, the crystal fused regions are formed so as to reach the semiconductor substrate from the surface of the first semiconductor layer. Thereby, cross talk between the photodiodes constituted by the first semiconductor layer and the second semiconductor layer can be more effectively prevented.

A method for making a photodiode array according to an embodiment of the present invention having a plurality of photodiodes formed on the semiconductor substrate, is characterized, by comprising the steps of epitaxially growing a first semiconductor layer having the same conductive type as that of the semiconductor substrate on the semiconductor substrate, forming a plurality of second semiconductor layers having an opposite conductive type to that of the semiconductor substrate on the surface side of the first semiconductor layer, forming crystal fused regions by adjusting converging points to the insides of the first semiconductor layer and semiconductor substrate and by being irradiated by laser lights along spaces between the plurality of second semiconductor layers to fuse the first semiconductor layer and the semiconductor substrate.

In the above-mentioned method for making the photodiode array, the photodiode is constituted by the pn junction of the first semiconductor layer and second semiconductor layer. The first semiconductor layer and the semiconductor substrate are fused to lose the crystallinity in the crystal fused region. Therefore, since the crystal fused regions for preventing the carriers from leaking to the adjoining photodiode can be suitably formed by the above-mentioned method for making the photodiode array, the photodiode array can be provided, which can suitably prevent cross talk between the plurality of photodiodes.

The means for preventing cross talk is obtained only by forming the crystal fused regions in the above-mentioned method for making the photodiode array. Therefore, the manufacturing process is simplified by the above-mentioned method for making the photodiode array as compared with the conventional method for making the photodiode array. Since the grooves are not physically formed on the photodiode array by the above-mentioned method for making the photodiode array, the photodiode array having maintained mechanical strength can be provided.

The crystal fused regions are preferably formed by adjusting the converging points to the insides of the first semiconductor layer and semiconductor substrate and by being irradiated by the laser lights at the step of forming the crystal fused regions in the method for making the photodiode array. In this case, the multiphoton absorption is generated because the laser lights are irradiated and converged, and thereby the crystal can be fused.

BRIEF DESCRIPTION OF THE DRAWINGS

FIG. 5 is an enlarged plan view of the photodiode array while forming crystal fused regions.

FIG. 12B is a sectional view showing the V-V section of the photodiode array shown in FIG. 12A.

DESCRIPTION OF THE PREFERRED EMBODIMENTS

Figure 1:
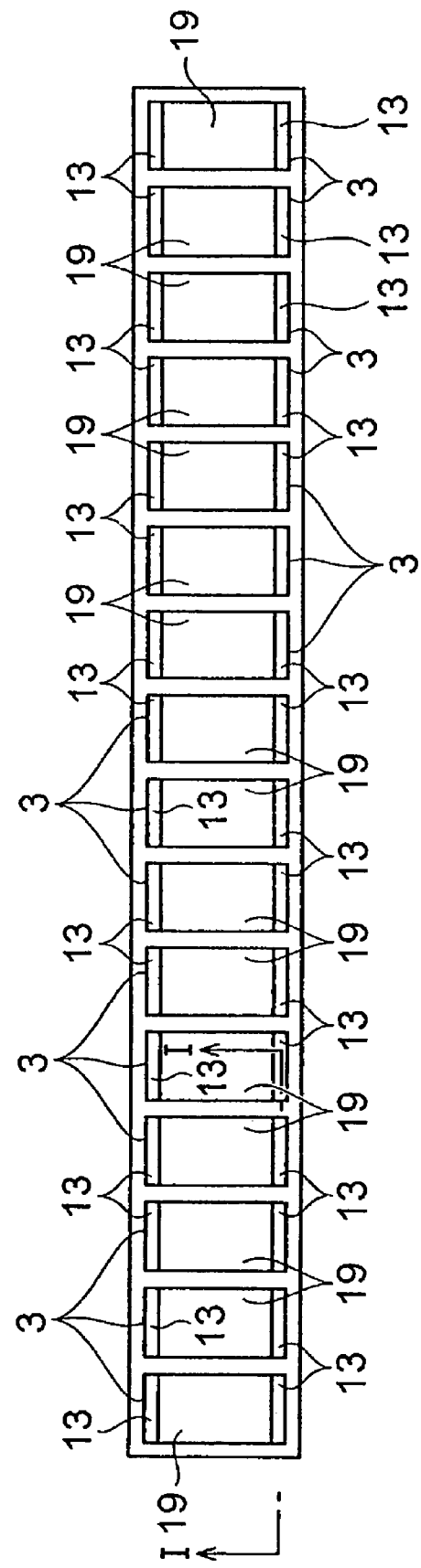
FIG. 1 is a plan view showing an embodiment of a photodiode array according to the present invention.

Hereafter, a photodiode array according to an embodiment of the present invention will be explained. Identical components are designated by the same reference numerals, and overlapping description is omitted.

Figure 2:
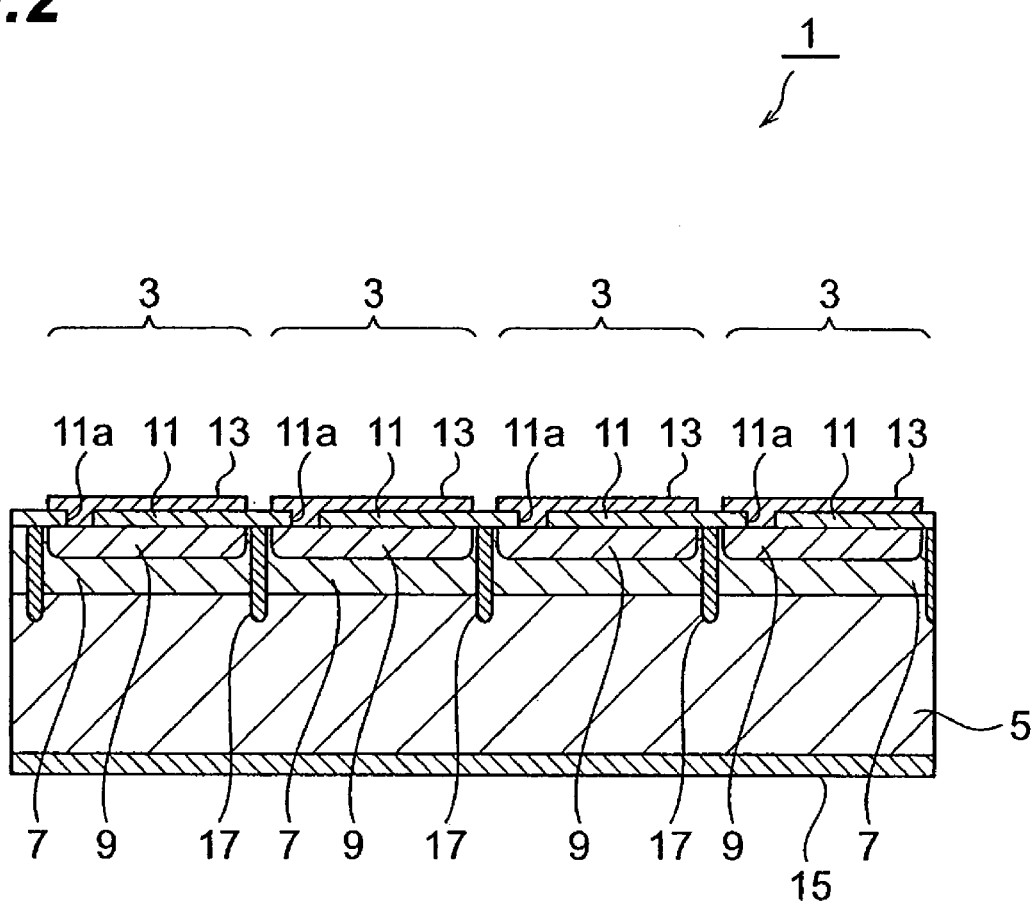
FIG. 2 is a sectional view showing the I-I section of the photodiode array shown in FIG. 1.

FIG. 1 is a plan view showing an embodiment of a photodiode array according to the present invention. FIG. 2 is a sectional view showing the I-I section of the photodiode array shown in FIG. 1. In the photodiode array 1 according to the embodiment, a plurality of photodiodes 3, for embodiment, of 16 pieces are one-dimensionally arranged.

With reference to FIG. 1, each of the photodiodes 3 has a photodetecting region 19. The photodiode 3 has a surface electrode 13 formed at the both ends of the photodetecting region 19.

With reference to FIG. 2, the photodiode array 1 is provided with a semiconductor substrate 5 consisting of an n-type semiconductor, a first semiconductor layer 7 formed on the semiconductor substrate 5 and consisting of a semiconductor having the same conductive type (n-type) as that of the semiconductor substrate 5, and a plurality of second semiconductor layers 9 formed on the surface side of the first semiconductor layer 7 and consisting of a semiconductor having an opposite conductive type (p-type) to that of the semiconductor substrate 5. The first semiconductor layer 7 is epitaxially grown on the semiconductor substrate 5, and contains n-type impurities having a lower concentration than p-type impurity concentration in the second semiconductor layer 9. The second semiconductor layer 9 is formed along the longitudinal direction of the photodiode array 1, and contains p-type impurities such as boron. A pn junction is composed by the first semiconductor layer 7 and the second semiconductor layer 9. The semiconductor material, impurity concentration and thickness of the semiconductor substrate 5, first semiconductor layer 7 and second semiconductor layer 9 of the embodiment are as follows.

TABLE 1

| Semiconductor Substrate | |
|---|---|
| Material | n-type Si |
| Impurity Concentration | $5 \times 10^{18}/cm^3$ |
| Thickness | 350 μm |
| First Semiconductor Layer | |
| Material | n-type Si |
| Impurity Concentration | $5 \times 10^{12}/cm^3$ |
| Thickness | 30 μm |
| Second Semiconductor Layer | |
| Material | p-type Si |
| Impurity Concentration | $1 \times 10^{19}/cm^3$ |
| Thickness | 0.5 μm |

Herein, the first semiconductor layer 7 has a lower impurity concentration as compared with that of the second semiconductor layer 9. A depletion layer extends to the first semiconductor layer 7 of the low concentration side from a pn junction interface at the time of zero bias or of applying a reverse bias voltage to a surface electrode 13 and a back electrode 15 as described later. Therefore, the photodetecting region 19 (refer to FIG. 1) on the surface of the photodiode array 1 is composed by a region corresponding to the second semiconductor layer 9. The conductive types of the first semiconductor layer 7 and second semiconductor layer 9 may be mutually reversed.

Elements isolating crystal fused regions 17 are respectively formed between the plurality of second semiconductor layers 9 (that is, between the plurality of photodiodes 3). The crystal fused regions 17 reach the semiconductor substrate 5 from the surface of the first semiconductor layer 7. With reference to the crystal fused region 17, the crystallinity of the semiconductor material is lost by fusing the semiconductor materials of the first semiconductor layer 7 and semiconductor substrate 5. The crystal fused region 17 showing the property is formed by a multiphoton absorption phenomenon generated by adjusting converging points to the insides of the first semiconductor layer 7 and semiconductor substrate 5 and by being irradiated by laser light. The method for forming the crystal fused region 17 due to the multiphoton absorption will be explained later in detail.

The photodiode array 1 is further provided with an insulating film 11 formed on the surfaces of the first semiconductor layer 7 and second semiconductor layer 9, the surface electrode 13 formed on the insulating film 11, the back electrode 15 formed on the bottom surface of the semiconductor substrate 5. Both $SiO_2$ and $SiN_x$ or any one of $SiO_2$ and $SiN_x$ are used as the material of the insulating film 11. When both $SiO_2$ and $SiN_x$ are used as the material of the insulating film 11, the insulating film 11 is formed as a composite film of $SiO_2$ and $SiN_x$, or a laminated film obtained by sequentially laminating $SiO_2$ and $SiN_x$. The insulating film 11 functions as a protective film for protecting the surface of the second semiconductor layer 9.

The surface electrode 13 consisting of a metal material such as Al and Au is formed on the insulating film 11 by a sputtering method and a depositing method or the like. Herein, the insulating film 11 described above has an opening (contact hole) 11a on the second semiconductor layer 9, and the surface electrode 13 is also formed in the opening 11a. Thereby, the surface electrode 13 is electrically connected to the second semiconductor layer 9. With reference to FIG. 1, the surface electrode 13 is formed at the both ends of the photodiode 3, and has a symmetry with respect to a direction orthogonal to the longitudinal direction of the photodiode array 1. A bonding wire is connected to the surface electrode 13 from both sides of the photodiode array 10 by the symmetry, and it is not necessary to take the direction of the photodiode array 1 into consideration in an assembly process, thereby improving the workability at the time of the assembly.

The back electrode 15 consisting of a metal material such as Al and Au is formed on the bottom surface of the semiconductor substrate 5 by the sputtering method and the depositing method or the like. The back electrode 15 is formed over the whole surface of the bottom surface of the semiconductor substrate 5, and is a common electrode for the plurality of photodiodes 3.

The photodiode array 1 having the above-mentioned structure performs the following operation. When a light to be detected enters into the photodetecting region 19 of the photodiode 3 from the surface side of the photodiode array 1, the light to be detected penetrates the insulating film 11 and reaches a light absorbing layer formed by the first semiconductor layer 7 and the second semiconductor layer 9. Carriers (electrons and holes) of an amount according to the intensity of the light to be detected are generated in the light absorbing layer. The carriers move according to the electric field in the semiconductor. The carriers are taken out from the back electrode 15 and the surface electrode 13, and outputted to the outside via the bonding wire (not shown). At this time, the movement of the carriers between the different photodiodes 3 is prevented by the crystal fused region 17.

Next, the method for making the photodiode array 1 described above will be explained. FIGS. 3A to 3C and 4A to 4C explain the method for making the photodiode array 1 according to the embodiment.

Figure 3A:
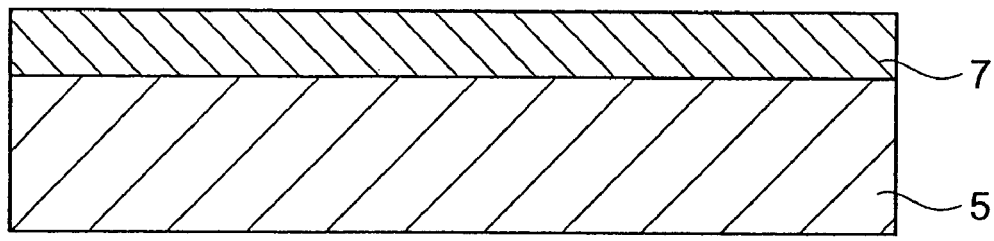
FIGS. 3A to 3C explain a method for making the photodiode array according to the embodiment.

First, as shown in FIG. 3A, the first n-type semiconductor layer 7 having a thickness of 30 μm is formed on the semiconductor substrate 5 (for embodiment, the thickness: 350 μm) consisting of the n-type semiconductor by using an epitaxial growth method.

Figure 3B:
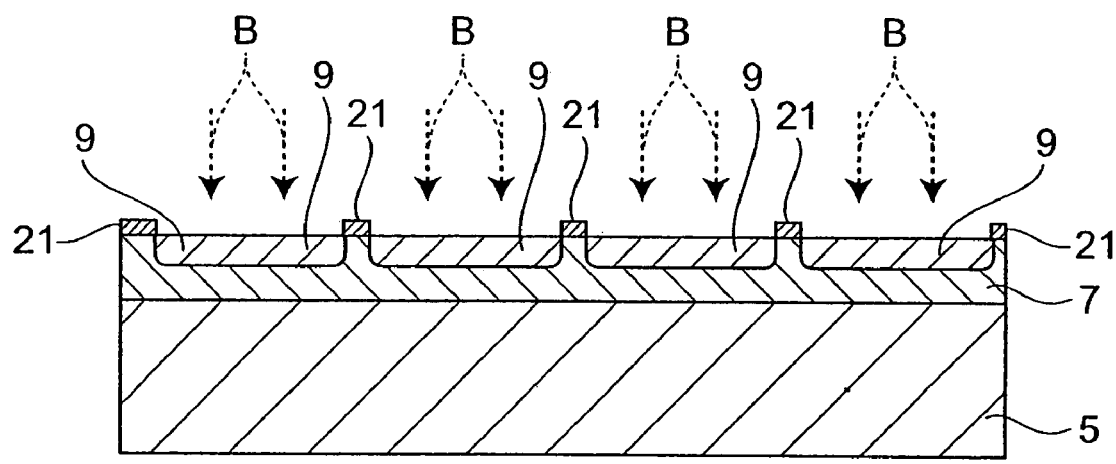

Then, as shown in FIG. 3B, a mask pattern 21 having a shape obtained by reversing the photodetecting region 19 (refer to FIG. 1) is formed on the surface of the first semiconductor layer 7. P-type impurities (boron or the like) are added to a surface layer part of the first semiconductor layer 7 from the exposed surface side of the first semiconductor layer 7 by diffusion or ion implantation (FIG. 3B). The conductive type of the surface layer part is reversed, and thereby the plurality of second semiconductor layers 9 are formed. The mask pattern 21 may work as a mask to the diffusion or ion implantation of the p-type impurities. For embodiment, the mask pattern 21 may be photoresist, and an oxide film, nitride film and metal or the like patterned by photoresist. At this time, the second semiconductor layer 9 having a thickness of, for embodiment, 0.5 μm is formed. After forming the second semiconductor layer 9, the mask pattern 21 is removed.

Figure 3C:
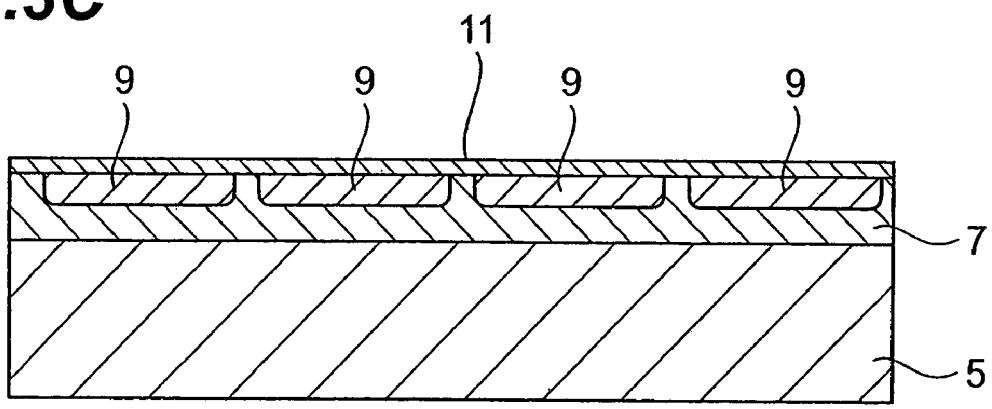

Then, as shown in FIG. 3C, the insulating film 11 is formed by depositing $SiO_2$ or $SiN_X$ on the exposed surfaces of the first semiconductor layer 7 and second semiconductor layer 9. Or the insulating film 11 may be formed by forming a laminated film obtained by sequentially laminating the composite film consisting of $SiO_2$ and $SiN_X$, or $SiO_2$ and $SiN_X$ on the exposed surfaces of the first semiconductor layer 7 and second semiconductor layer 9. At this time, the insulating film 11 having a thickness of, for embodiment, 0.1 μm is deposited. A CVD (chemical vapor deposition) method and the sputtering method or the like may be used as a method for depositing the insulating film 11.

Figure 4A:
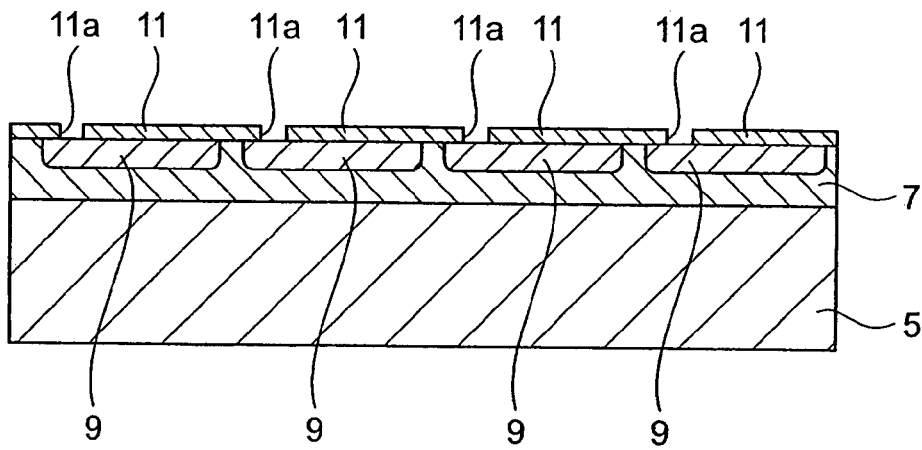
FIGS. 4A to 4C explain a method for making the photodiode array according to the embodiment.
Figure 4B:
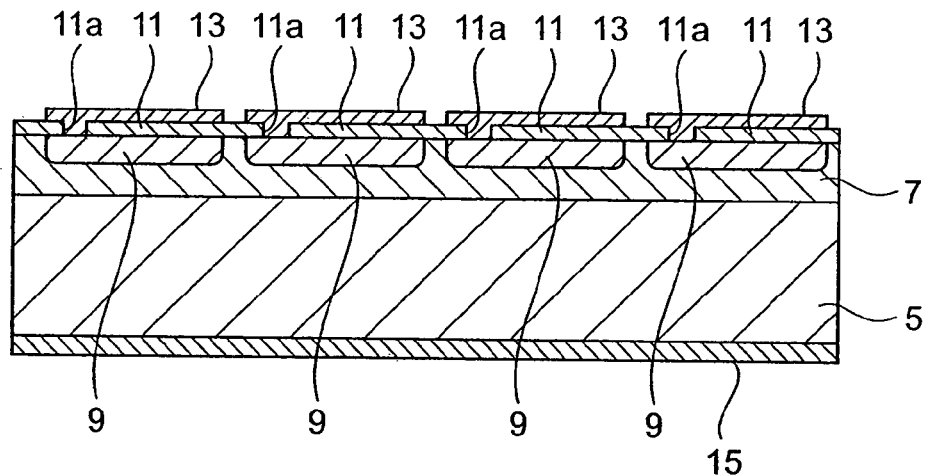

Then, as shown in FIG. 4A, so as to electrically contact to the second semiconductor layer 9, the opening 11a is formed in a predetermined region of the insulating film 11 by a usual photolithography technique, and the surface of the second semiconductor layer 9 is exposed. As shown in FIG. 4B, the surface electrode 13 and the back electrode 15 are formed by the sputtering method and the depositing method or the like.

Figure 4C:
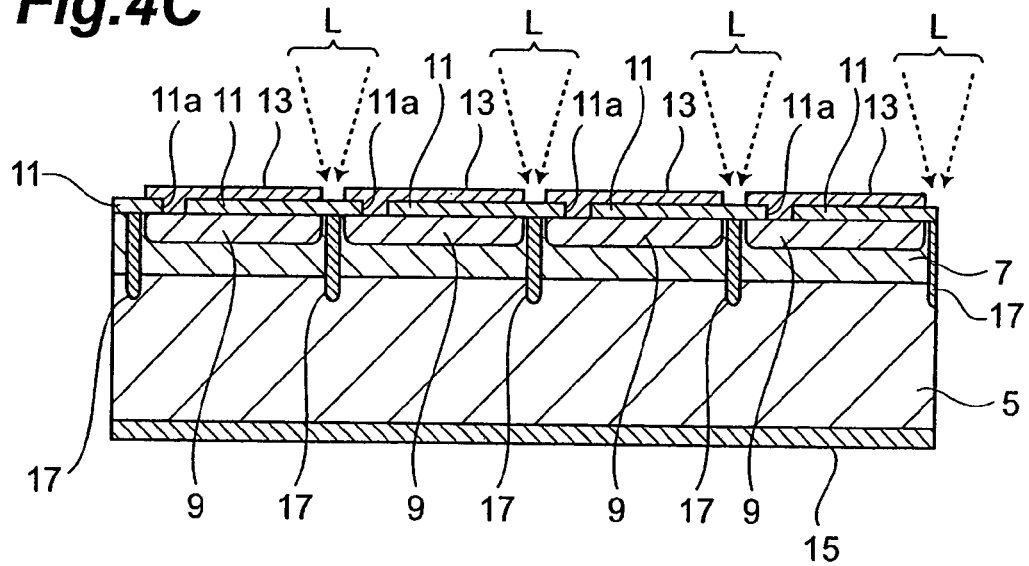

Then, as shown in FIG. 4C, the crystal fused regions 17 are formed by irradiated laser lights L along the spaces between the plurality of second semiconductor layers 9. At this time, converging points are adjusted to the insides of the first semiconductor layer 7 and semiconductor substrate 5, and the laser lights L are irradiated. Thus, when the laser lights L are irradiated, the multiphoton absorption phenomenon is generated in the first semiconductor layer 7 and the semiconductor substrate 5, and the semiconductor material is fused to lose the crystallinity of the semiconductor material. At this time, for embodiment, the crystal fused regions 17 are formed at depths of 40 to 50 μm from the first semiconductor layer 7 so that the crystal fused region 17 reaches the surface of the semiconductor substrate 5 from the surface of the first semiconductor layer 7. The crystal fused regions 17 having a width of, for embodiment, 2 to 3 μm are formed in a direction along the spaces between the second semiconductor layers 9.

Finally, the circumference of the photodiode array 1 is diced, and the photodiode array 1 is cut. According to the above-mentioned processes, the photodiode array 1 shown in FIGS. 1 and 2 is completed.

Herein, the formation of the crystal fused region 17 using the multiphoton absorption will be further explained in detail. The crystal fused region 17 according to the embodiment is formed by the following laser light machining method. That is, in the laser light machining method used for the embodiment, the fused region is formed in the semiconductor material by the multiphoton absorption generated when the intensity of the laser light is abundantly enlarged. First, the multiphoton absorption is briefly explained.

When the energy hv of photon is smaller than the band gap $E_G$ of the absorption of the material, the material becomes optically transparent. Therefore, a condition where the absorption is generated in the material is hv>$E_G$. However, even when the material is optically transparent, the absorption is generated in the material in a condition of nhv>$E_G$ (n=2, 3, 4 . . . ) when the intensity of the laser light is abundantly enlarged. The phenomenon is referred to as multiphoton absorption. In the case of the pulse wave, the intensity of the laser light is determined by the peak power density (W/cm$^2$) of the converging point of the laser light. For embodiment, when the peak power density is 1×10$^8$ (W/cm$^2$) or more, the multiphoton absorption is generated. The peak power density is calculated by (energy per one pulse of laser light in converging point)/(beam spot cross section area of laser light×pulse width). In the case of the continuous wave, the intensity of the laser light is determined by the electric intensity (W/cm$^2$) of the converging point of the laser light.

Figure 6:
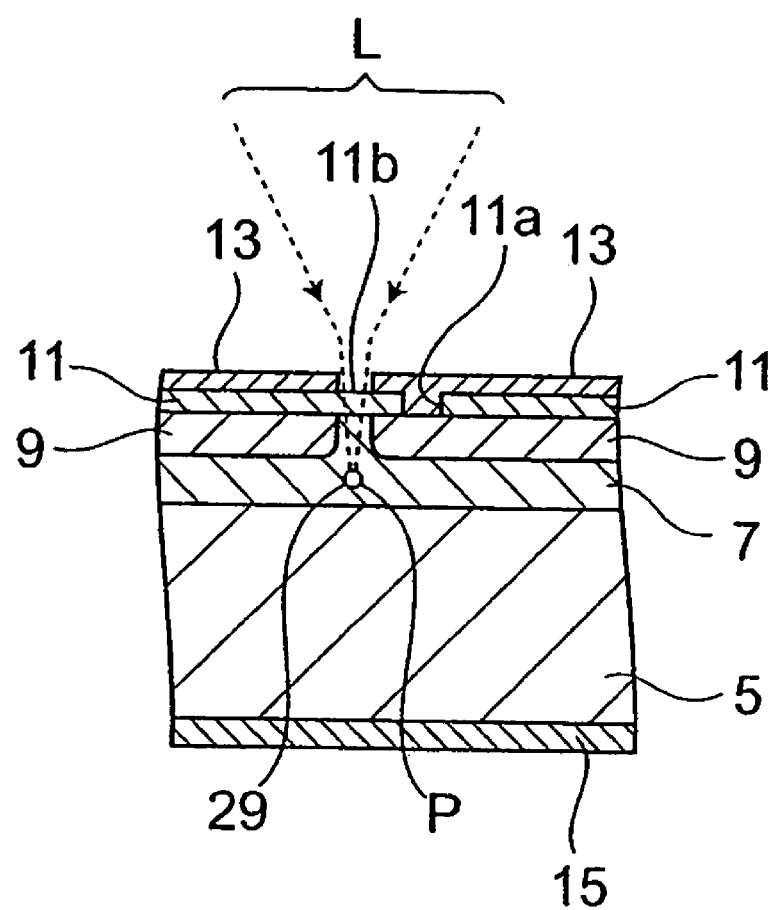
FIG. 6 is a sectional view showing the II-II section of the photodiode array shown in FIG. 5.
Figure 7:
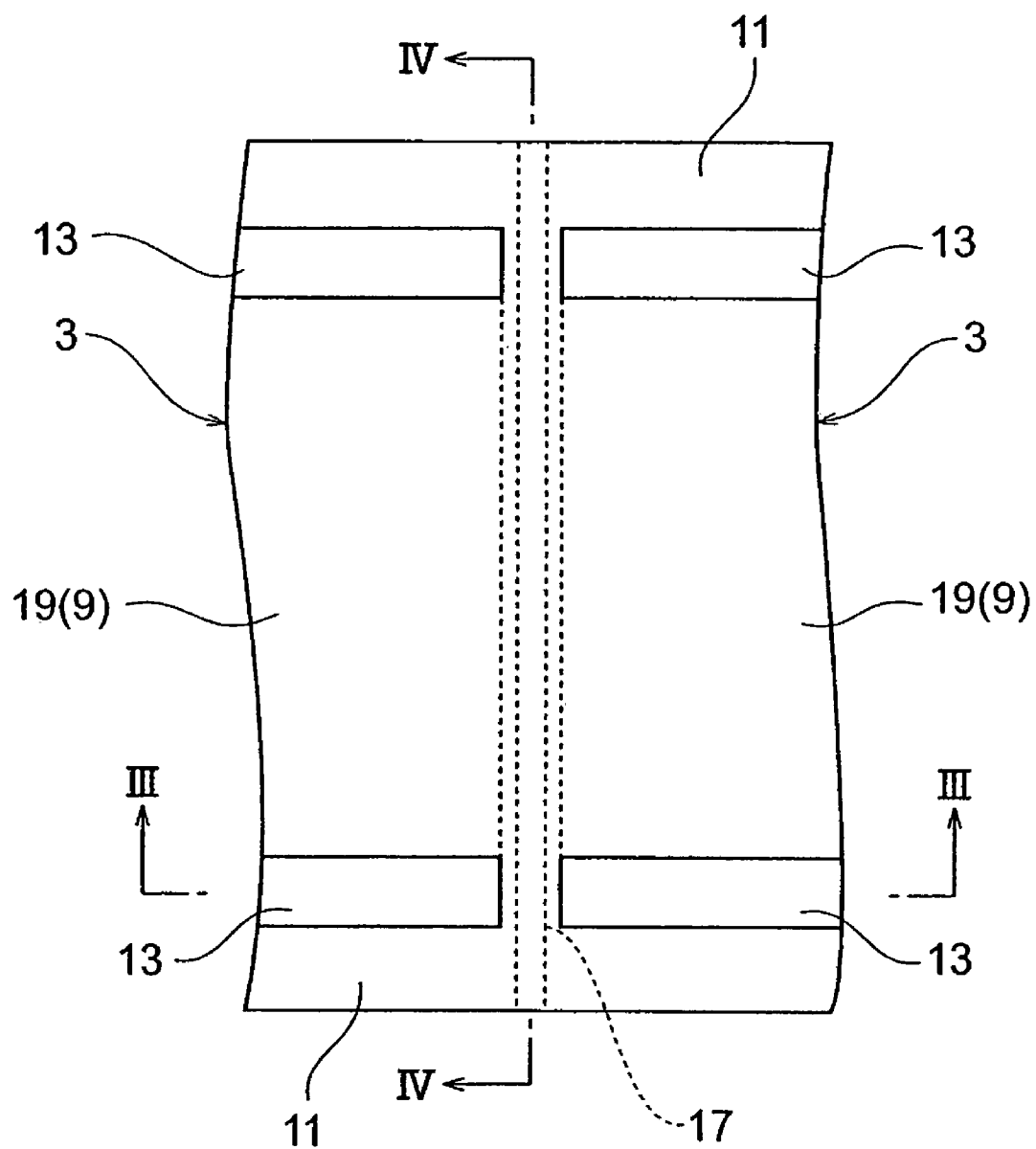
FIG. 7 is an enlarged plan view of the photodiode array after forming the crystal fused regions.
Figure 8:
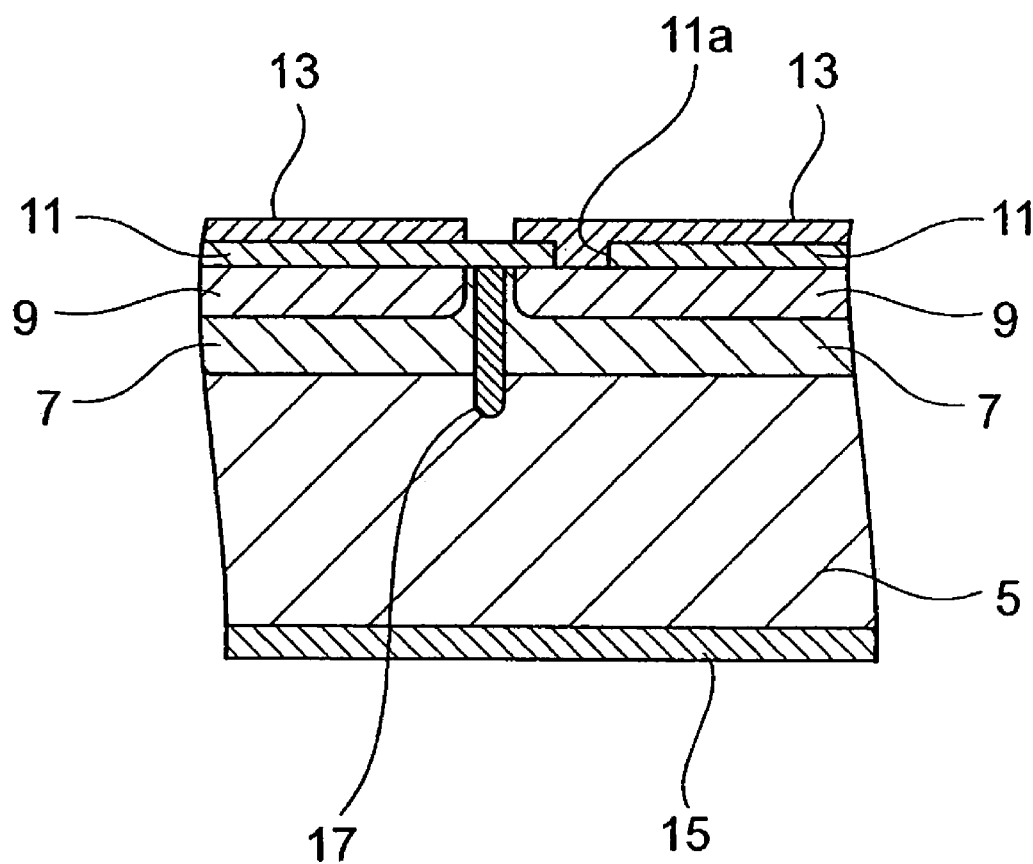
FIG. 8 is a sectional view showing the III-III section of the photodiode array shown in FIG. 7.
Figure 9:
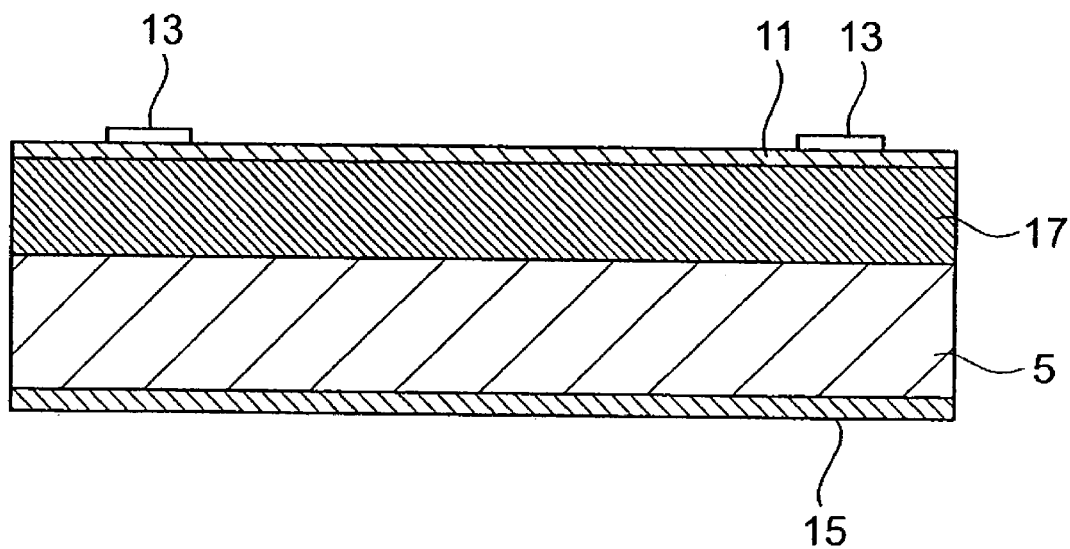
FIG. 9 is a sectional view showing the IV-IV section of the photodiode array shown in FIG. 7.

The formation process of the crystal fused region 17 according to the embodiment using the multiphoton absorption is explained by using FIGS. 5 to 9. FIG. 5 is an enlarged plan view of the photodiode array 1 while forming the crystal fused region 17. FIG. 6 is a sectional view showing the II-II section of the photodiode array shown in FIG. 5. FIG. 7 is an enlarged plan view of the photodiode array 1 after forming the crystal fused region 17. FIG. 8 is a sectional view showing the III-III section of the photodiode array shown in FIG. 7. FIG. 9 is a sectional view showing the IV-IV section of the photodiode array 1 shown in FIG. 7.

As shown in FIGS. 5 and 6, a formation predetermined line 27 for forming the crystal fused region 17 on the surface of the photodiode array 1 is supposed. The formation predetermined line 27 is a virtual line linearly extended, and is supposed along the space (that is, the space between the photodetecting regions 19) between the plurality of photodiodes 3. In the embodiment, a crystal fused portion 29 is formed by adjusting a converging point P to the insides of the first semiconductor layer 7 and semiconductor substrate 5 so that the multiphoton absorption is generated and by being irradiated by a laser light L. The converging point P means a portion to which the laser light L is converged.

The converging point P is moved along the formation predetermined line 27 by relatively moving the laser light L along the formation predetermined line 27 (that is, along the direction of an arrow A). Though the crystal fused region 17 of about 50 μm can be usually made in a depth direction, when a deeper crystal fused region is required, the converging point P can also be moved in the depth direction of the photodiode array 1 by relatively moving the laser light L in the depth direction of the photodiode array 1. Thereby, as shown in FIGS. 7 to 9, the crystal fused region 17 reaching the semiconductor substrate 5 and having a predetermined depth is formed in only the first semiconductor layer 7 and the semiconductor substrate 5 along the formation predetermined line 27.

The formation method of the above-mentioned crystal fused region 17 is not that the first semiconductor layer 7 and the semiconductor substrate 5 simply absorb the laser light L, thereby making the semiconductor material generate heat to form the crystal fused region 17. The crystal fused region 17 is formed by penetrating the laser light L in the first semiconductor layer 7 and the semiconductor substrate 5, generating the multiphoton absorption in the first semiconductor layer 7 and the semiconductor substrate 5 to make the semiconductor material generate heat in the portion and to lose the crystallinity of the semiconductor material. Therefore, since the laser light L is hardly absorbed in a surface protection film of the first semiconductor layer 79, the surface protection film of the first semiconductor layer 7 is not fused.

The photodiode array 1 according to the embodiment explained above has the following effects. That is, the photodiode array 1 according to the embodiment is provided with the crystal fused regions 17 respectively formed between the plurality of photodiodes 3. The semiconductor material loses the crystallinity in the crystal fused region 17. Therefore, since the crystal fused region 17 blocks the carriers which will move to the adjoining photodiode 3 according to the above-mentioned photodiode array 1, cross talk between the plurality of photodiodes 3 can be suitably prevented.

In the photodiode array 1 according to the embodiment, the crystal fused region 17 reaches the semiconductor substrate 5 from the surface of the first semiconductor layer 7, and is formed so as to be projected by about 20 μm to the semiconductor substrate 5. Thereby, the carriers generated in the first semiconductor layer 7 can be prevented from turning around the bottom of the crystal fused region 17, and cross talk between photodiodes 3 can be more effectively prevented. The generating depth of the carriers generated in the photodiode 3 is usually different according to the wavelength of the light to be detected. Therefore, cross talk can be more effectively prevented by setting the depth of the crystal fused region 17 according to the wavelength of the light to be detected. When the light to be measured has a particularly long wavelength, the crystal fused region 17 having the depth according to the wavelength can be formed, and cross talk can be fully prevented by using the low resistant semiconductor substrate 5.

The photodiode 3 is constituted by the pn junction of the first semiconductor layer 7 and second semiconductor layer 9 in the method for making the photodiode array 1 according to the embodiment. The first semiconductor layer 7 and the semiconductor substrate 5 are fused to lose the crystallinity in the crystal fused region 17. Therefore, since the crystal fused region 17 for preventing the carriers from moving to the adjoining photodiode 3 can be suitably formed by the method for making the photodiode array 1 according to the embodiment, the photodiode array 1 capable of suitably preventing cross talk between the plurality of photodiodes 3 can be provided.

The means for preventing cross talk between the plurality of photodiodes 3 is obtained only by forming the crystal fused region 17 in the photodiode array 1 of the embodiment and the method for making the same. Therefore, according to the photodiode array 1 of the embodiment and the method for making the same, the manufacturing process can be reduced as compared with the conventional photodiode array requiring the step of forming the trench groove and the insulating layer, and the step of filling the trench grooves and the method for making the same like the photodiode array disclosed in Japanese Patent Laid-Open Publication No. 2001-352094.

For embodiment, when the trench grooves are formed, the minute pieces of the semiconductor material may be generated in the conventional photodiode array and the method for making the same disclosed in Japanese Patent Laid-Open Publication No. 2001-352094. When the minute pieces remain on the photodiode 3, the carriers may be leaked by the minute pieces. On the other hand, since it is not necessary to perform processing such as the formation of the trench grooves according to the photodiode array 1 of the embodiment and the method for making the same, the minute pieces are not generated, and the generation of the leak or the like is lost. Since the photodiode array 1 may not be provided with the physical groove such as the trench groove, the mechanical strength of the photodiode array 1 can be maintained.

The width of the crystal fused region 17 is several μm (for embodiment, 2 to 3 μm), and the crystal fused region 17 is very narrowly formed in the photodiode array 1 of the embodiment and the method for making the same. On the other hand, in the conventional photodiode array and the method for making the same (for embodiment, Japanese Patent Laid-Open Publication No. 2001-352094), the width of the trench groove of about 10 μm is required in view of processed accuracy, and thereby the open area ratio of the surface of the photodiode array is sacrificed. Since cross talk can be prevented by the crystal fused region 17 having the width of about several μm according to the photodiode array 1 of the embodiment and the method for making the same, the open area ratio of the photodiode array 1 can be further enlarged. Therefore, the pitch between the pixels can be further reduced, and the resolution can be further enhanced.

Figure 10:
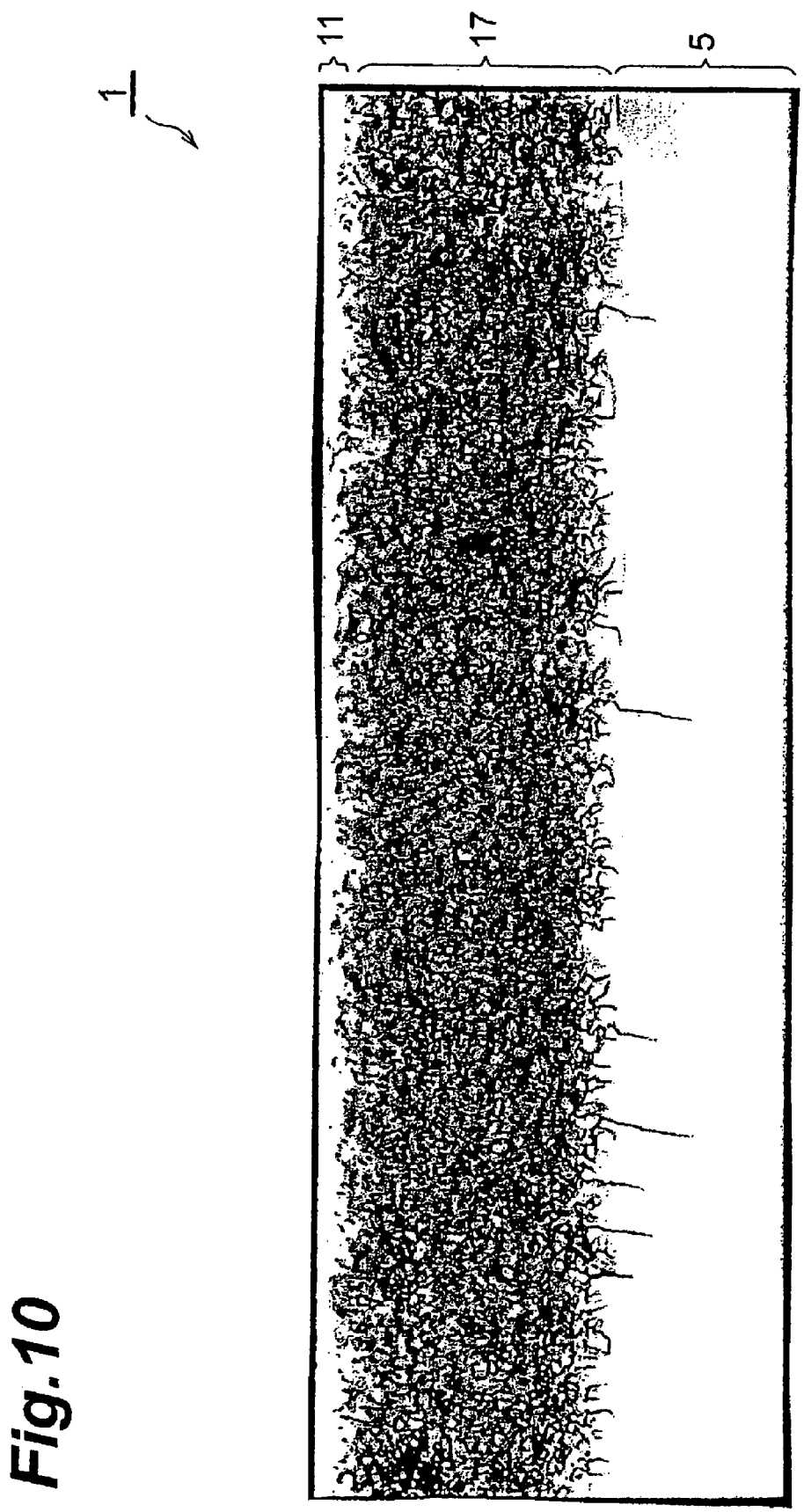
FIG. 10 is a scanning electron microscope (SEM) photograph showing an embodiment of the photodiode array according to the embodiment.

FIG. 10 is a scanning electron microscope (SEM) photograph showing the embodiment of the photodiode array 1 according to the above-mentioned embodiment. The photograph shown in FIG. 10 shows a cross section obtained by cutting the photodiode array 1 of the above-mentioned embodiment along the space of the photodiode 3. FIG. 10 shows that the crystal fused region 17 having a predetermined depth (50 μm in the embodiment) so as to reach the semiconductor substrate 5 is formed. Though the width of the crystal fused region 17 cannot be distinguished from the photograph, the width is 1 μm in the embodiment. Thus, according to the photodiode array 1 of the above-mentioned embodiment and the method for making the same, the crystal fused region 17 having a large aspect ratio of a width of 1 μm and depth of 50 μm can be formed. A deeper crystal fused region than the embodiment can also be formed by forming the crystal fused region 17 while scanning the focus of the laser light in a depth direction.

In the embodiment, a semiconductor wafer having a diameter of 6 inches (the thickness of 100 μm) is used, and the crystal fused region is formed by the irradiated laser light in a grid shape at 5 mm intervals with a tape stuck on the whole back surface of the semiconductor wafer. The semiconductor wafer is divided into chips of 5 mm×5 mm around the crystal fused region by expanding the tape and the section of the chip is photographed.

Figure 11:
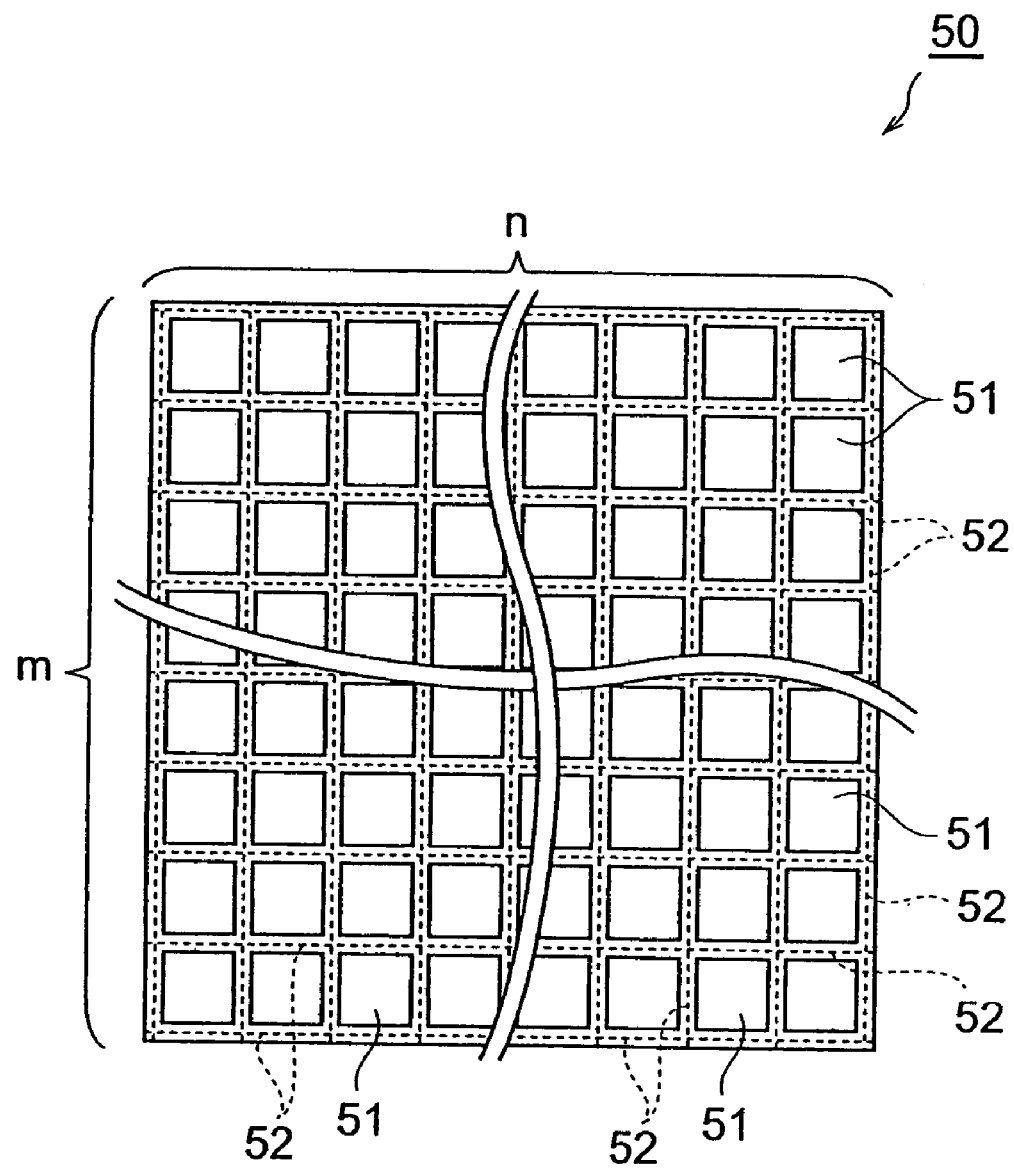
FIG. 11 is a plan view showing a modification of the photodiode array according to the above-mentioned embodiment.

The present invention is not limited to the above-mentioned embodiment and modification, and various modifications can be performed. For embodiment, the arrangement of the photodiodes in the photodiode array may not only be one-dimensional arrangement shown in FIG. 1 but also a two-dimensional arrangement shown, for embodiment, in FIG. 11. The photodiode array 50 shown in FIG. 11 is provided with a plurality of photodiodes 51 arranged in m rows and n columns. The crystal fused regions 52 are respectively formed between the plurality of photodiodes 51. Thus, the provision of the crystal fused regions 52 formed between the photodiodes 51 two-dimensionally arranged can also suitably prevent cross talk between the photodiodes 51.

Figure 12A:
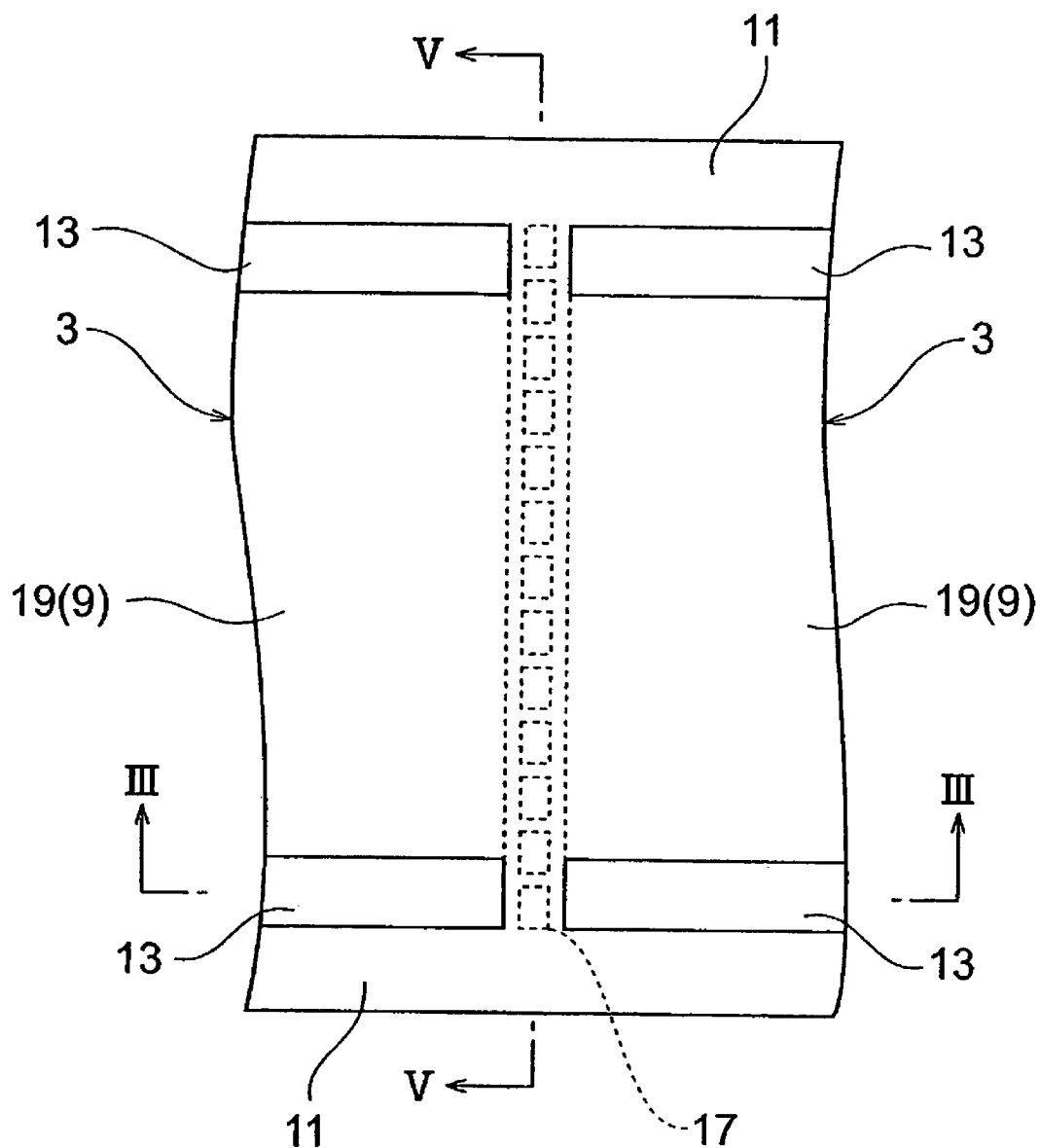
FIGS. 12A and 12B are respectively a plan view and sectional view showing another modification of the photodiode array according to the embodiment described above.
Figure 12B:
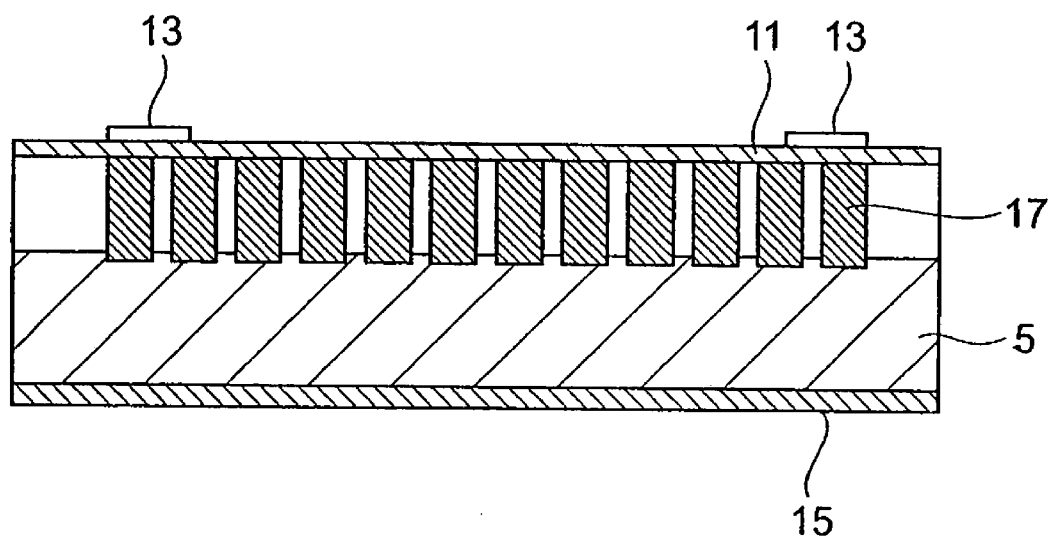
Figure 13:
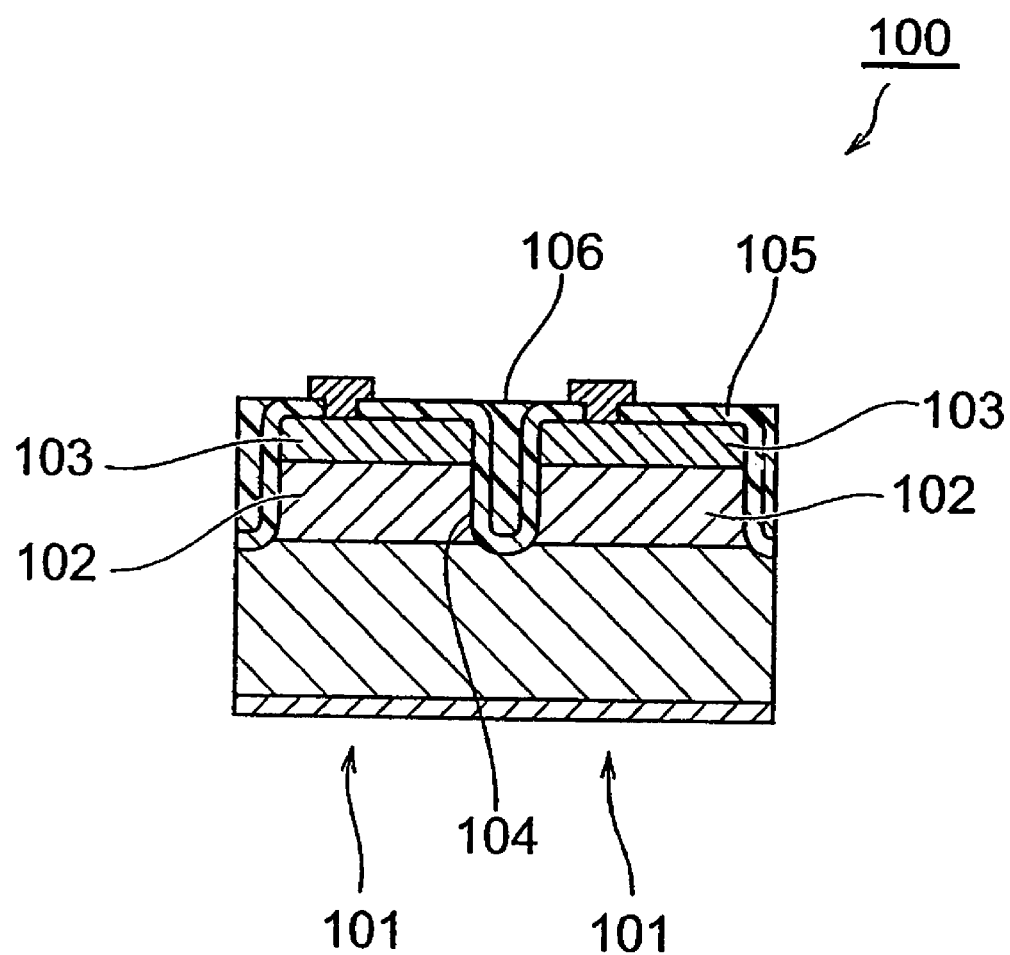
FIG. 13 is a sectional view showing a photodiode array disclosed in Japanese Patent Laid-Open Publication No. 2001-352094.

Though the crystal fused regions are continuously formed along the spaces between the adjoining photodiodes in the above-mentioned embodiment and modification, as shown in, for embodiment, FIGS. 12A and 12B, the crystal fused regions may be discontinuously formed in the form of a dot at intervals of the range capable of preventing cross talk between the photodiodes. Though the formation of the crystal fused region is based on the multiphoton absorption in the above-mentioned embodiment and modification, the formation is not limited thereto. The method for losing the crystallinity of the semiconductor material such as the condensing of the laser light can be used.

According to the photodiode array of the embodiment of the present invention and the method for making the same, the photodiode array can be formed by a simple process, and cross talk can be prevented while maintaining the mechanical strength.

What is claimed is:

1. A method for making a photodiode array,
having a plurality of photodiodes formed on a semiconductor substrate, comprising the steps of:
epitaxially growing a first semiconductor layer having the same conductive type as that of the semiconductor substrate on the semiconductor substrate;
forming a plurality of second semiconductor layers having an opposite conductive type to that of the semiconductor substrate on the surface side of the first semiconductor layer; and
forming crystal fused regions by adjusting converging points of laser lights to the insides of the first semiconductor layer and semiconductor substrate and by being irradiated by laser lights along spaces between the plurality of second semiconductor layers to fuse the first semiconductor layer and the semiconductor substrate,
wherein a semiconductor material making up at least one of said photodiodes is Si, and
wherein in the step of forming crystal fused regions, a laser light having a photon energy smaller than the band gap of the absorption of Si is irradiated with at least one of said adjusted converging points of the laser light to be inside of the semiconductor material and between the plurality of photodiodes, to form a crystal fused region.

2. The method for making the photodiode array according to claim 1, wherein the crystal fused regions are continuously formed at the step of forming the crystal fused regions.

3. A method for making a photodiode array,
having a plurality of photodiodes formed on a semiconductor substrate, comprising the steps of:
forming a plurality of first semiconductor layers having an opposite conductive type to that of the semiconductor substrate on a surface of the semiconductor substrate which is a first conductive type; and
forming crystal fused regions of fused single crystal semiconductor material by adjusting converging points of laser lights to the insides of the semiconductor substrate and by being irradiated by laser lights along spaces between the plurality of the first semiconductor layers to fuse the semiconductor substrate,
wherein a semiconductor material making up at least one of said photodiodes is Si, and
wherein in the step of forming crystal fused regions, a laser light having a photon energy smaller than the band gap of the absorption of Si is irradiated with at least one of said adjusted converging points of the laser light to be inside of the semiconductor material and between the plurality of photodiodes, to form a crystal fused region.

4. The method for making the photodiode array according to claim 3, wherein the crystal fused regions are continuously formed at the step of forming the crystal fused regions.

* * * * *